United States Patent [19]

Basawapatna

[11] 4,401,952

[45] Aug. 30, 1983

[54] MICROWAVE SWITCHED AMPLIFIER/MULTIPLIER

[75] Inventor: Ganesh R. Basawapatna, Santa Rosa, Calif.

[73] Assignee: Microsource, Inc., Santa Rosa, Calif.

[21] Appl. No.: 285,211

[22] Filed: Jul. 20, 1981

[51] Int. Cl.$^3$ .......................... H03F 3/16; H03F 3/60
[52] U.S. Cl. .................................... 330/277; 330/286
[58] Field of Search ......................... 330/51, 277, 286

[56] References Cited

PUBLICATIONS

Pengelly et al., A Comparison Between Actively and Passively Matched S-Band GAas Monolithic FET Amplifiers, IEEE Conference, IEEE International Microwave Symposium Digest, Jun. 1981.

Primary Examiner—James B. Mullins
Assistant Examiner—Gene Wan
Attorney, Agent, or Firm—Townsend & Townsend

[57] ABSTRACT

A solid-state microwave signal amplifying and multiplying apparatus capable of substantially continuous tuning over an extended frequency range in the microwave region. A single gallium arsenide metal semiconductor field-effect transistor (MESFET) is switchably coupled by means of PIN diodes through selected output matching networks consisting of relatively narrow-band frequency sections. Bias to the MESFET is provided through PIN diodes in a manner to select a linear (fundamental frequency) or nonlinear (multiplied frequency) operating region. In this manner a single microwave active device may be utilized with a plurality of passive networks to achieve extremely wideband amplification meeting good amplification and impedance matching criteria.

9 Claims, 3 Drawing Figures

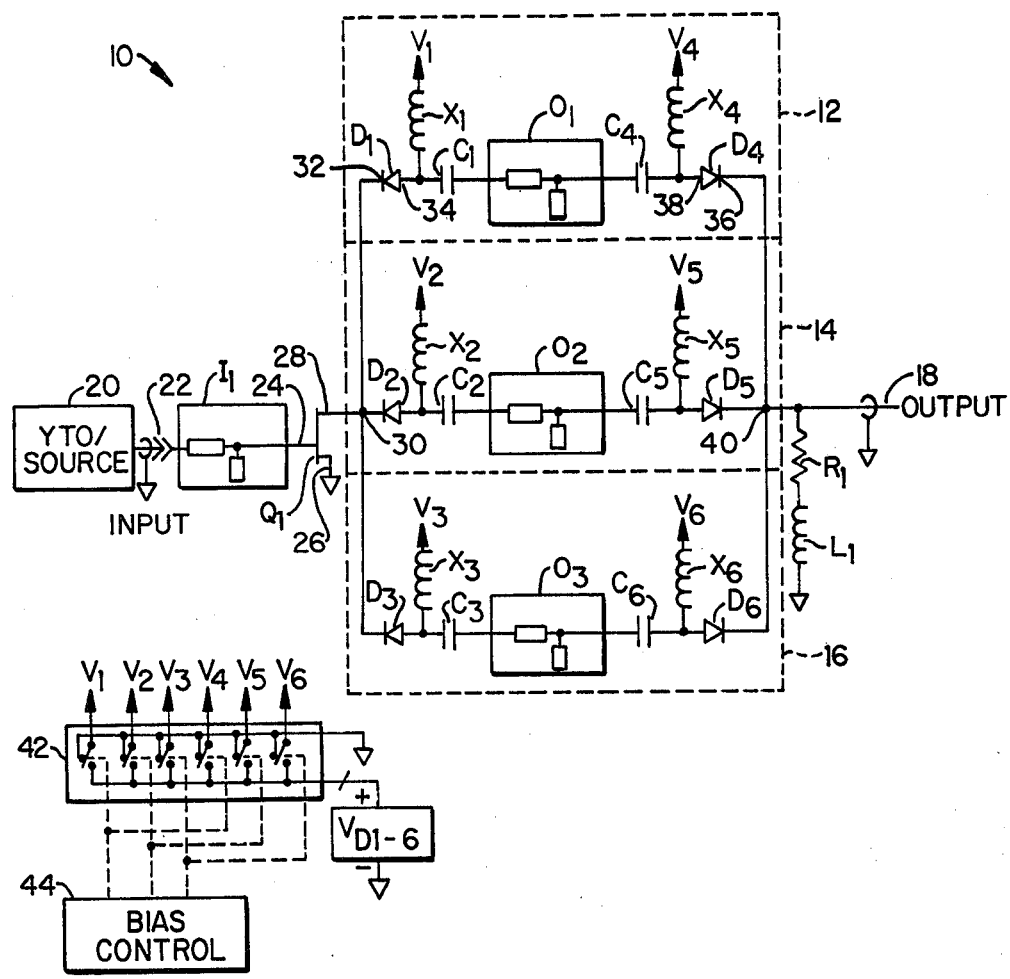
FIG.\_1.

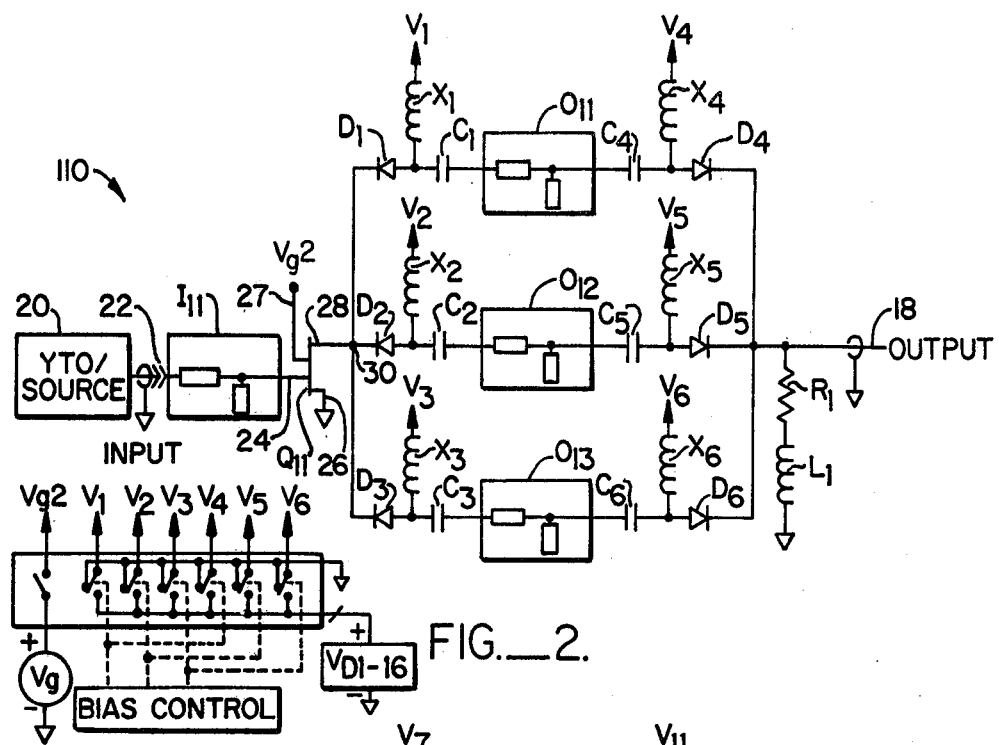
FIG._2.
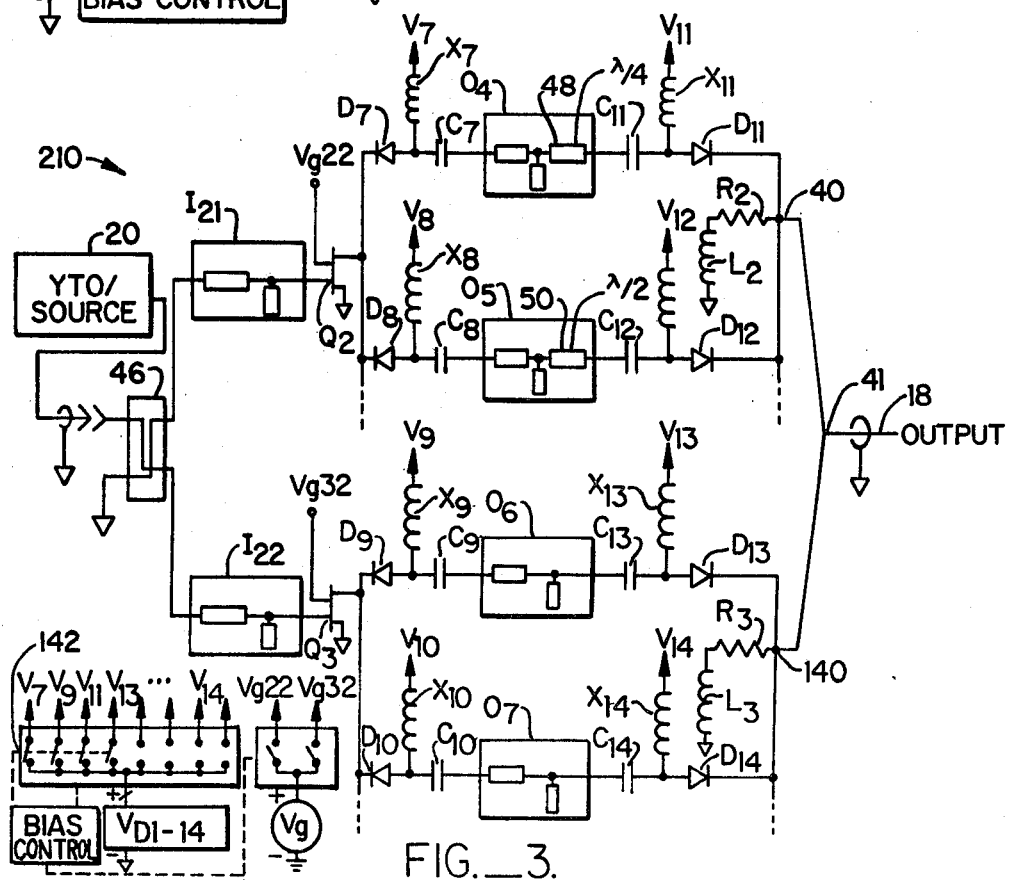
FIG._3.

MICROWAVE SWITCHED AMPLIFIER/MULTIPLIER

BACKGROUND OF THE INVENTION

This invention relates to microwave amplification, and particularly it relates to an apparatus and techniques for providing an amplifier capable of substantially continuous tuning between about 1 GHz and about 30 GHz with relatively flat gain and good impedance match. The invention is particularly useful in the realization of wideband microwave test equipment employing a signal source, such as a YIG-tuned oscillator.

Signal sources are presently available in microwave test equipment which cover frequency ranges of about 2 GHz to about 26.5 GHz in the form of sweep oscillators, signal generators and frequency synthesizers. Such signal sources are inherently very expensive because it has heretofore not been possible to design a single microwave microcircuit capable of generating signals over a broad frequency range with relatively flat gain and impedance. The normal approach for such instruments is to partition the frequency range over which operation is desired into relatively narrow-band segments based on the design frequency range of passive matching networks or active device gain regions and then to provide for each frequency range a linear amplifier and matching network specific to the segmented frequency range. The output of each device in a particular segmented frequency range is then typically routed through an electromechanical switch or a switching diode to a common output terminal.

In recent years, the availability of gallium arsenide metal semiconductor field-effect transistors (MESFETs) has made it possible to provide amplification of electrical signals in the microwave region up to about 40 GHz and beyond using only solid-state devices. Moreover, MESFETs can be operated as nonlinear devices producing harmonics if biased to operate in a nonlinear region. Dual-gate MESFETs in particular have been shown to exhibit pronounced nonlinearities which can be employed to advantage to provide high efficiency multiplication.

Unfortunately the input and output impedances of the GaAs MESFET have made it difficult to achieve single device wide bandwidth operation. Still further, harmonic operation of a device causes the generation of unwanted harmonics and other spurious signals which are not readily controlled in a wide bandwidth device, i.e., a device operative over more than about two octaves.

Description of the Prior Art

Because of the problem with harmonic generation and the inability to control harmonic generation, it has been the practice in applications of signal source instrumentation to provide narrow-band frequency matching networks each provided with a separate linear amplifier and frequency multiplier. In this manner, proper biasing and impedance matching for each active device can be provided independently for each frequency segment. Heretofore, no use is known in the microwave instrumentation application of a single GaAs MESFET operating in the same circuit both in the linear region of its transfer characteristic as a linear amplifier and in the nonlinear regions of its transfer characteristic as a frequency multiplier. The supposed operating difficulties of employing a microwave frequency amplifying element as a switched amplifier or multiplying element have heretofore suggested away from multiple function applications.

SUMMARY OF THE INVENTION

According to the present invention a solid-state microwave amplifying element, such as a gallium arsenide metal semiconductor field-effect transistor (MESFET), is employed as a switched amplifier/multiplier in connection with a plurality of channels each comprising PIN switching diodes and a passive output matching network to provide a wideband microwave circuit employing only a single amplifying element. In addition, a balanced configuration is provided employing only two amplifying elements. In a preferred embodiment, a dual-gate MESFET is employed as the amplifying element. Switchable DC bias circuitry simultaneously provides the bias levels for diode switched channel selection and selection of the frequency range of operation of the amplifying or multiplying device of the apparatus.

One of the objects and advantages of the invention is the minimization of cost and complexity of the amplifier. Amplifying elements at microwave frequencies are generally very expensive. Thus, elimination of amplifying elements represents a substantial cost savings. Reducing complexity also reduces failure susceptibility.

The invention eliminates need for an amplifying element for each frequency range. Also, the invention enables the construction of a single microcircuit with all matching networks including filter elements in a single unit, such as a microwave hybrid microcircuit or stripline circuit. The result is substantial miniaturization.

A still further advantage to the invention is the ability to control the operating frequency of an amplifier merely by switching among preselected voltage bias levels. A voltage controlled continuous sweep oscillator may be constructed by use of a circuit according to the invention.

A still further advantage of the invention is exceptional suppression of the harmonics of the amplifying element resulting in extremely good harmonic suppression relative to the intended output signal over the entire frequency operating range.

Other objects and advantages of this invention will be apparent upon reference to the following detailed description taken in connection with the accompanying drawings.

BRIEF DESCRIPTION OF THE DRAWINGS

FIG. 1 is a schematic diagram of a first embodiment of a microwave solid-state amplifier/multiplier according to the invention.

FIG. 2 is a schematic diagram of a second embodiment of an amplifier/multiplier according to the invention.

FIG. 3 is a schematic diagram of a third embodiment of an amplifier/multiplier according to the invention.

DETAILED DESCRIPTION OF SPECIFIC EMBODIMENTS

FIG. 1 illustrates a first embodiment of an amplifier/multiplier 10 according to the invention. The apparatus includes an input matching network $I_1$, and first, second and third signal channel elements 12, 14 and 16 coupled in parallel between the amplifying element $Q_1$ and a system output 18. The number of signal channel elements is determined by the design bandwidth coverage of each element, and the total desired spectrum coverage of the amplifier/multiplier 10. The frequency ranges and number of channel elements described herein are merely suggestive of specific embodiments and therefore should not be viewed as limiting of the invention.

The amplifier/multiplier 10 is adapted to be coupled at its input to a YIG-tuned oscillator/source (YTO) 20 or other suitable microwave signal source through an appropriate microwave frequency coupling 22. If, for example, the YTO 20 has a continuous output frequency tuning range of, for example, 2 GHz to 8 GHz, the second harmonic thereof would be 4 GHz to 16 GHz and the third harmonic would be 6 GHz to 24 GHz. By proper choice of excitation voltage to the YTO 20, a continuous tuning range can be established. As an example, suitable ranges are 2 GHz to 4 GHz in the fundamental, 4 GHz to 8 GHz in the second harmonic, and 8 GHz to 24 GHz in the third harmonic using separate operating channels. Another example of a suitable set of tuning ranges for a channel selectable amplifier/multiplier is 2 GHz to 6 GHz in the fundamental, 6 GHz to 12 GHz in the second harmonic, and 12 GHz to 18 GHz or 24 GHz in the third harmonic or fourth harmonic. Whereas the prior art employed separate amplifiers in each range of operations, the present invention involves the use of only a single amplifying element operating selectively in its linear region and in its nonlinear regions under preselectable bias control.

The signal channel elements 12, 14 and 16 are substantially identical except for the intended passband frequency range of operation. Each signal channel element includes, respectively, an output matching network $O_1$, $O_2$, $O_3$ whereby the impedance in the frequency range of interest is matched to the impedance of the system output 18. In the absence of output matching, an undesirably high amount of the amplified power would be reflected due to impedance mismatch so that the gain of the apparatus would suffer from undue inefficiency.

The components comprising the output matching networks $O_1$, $O_2$ and $O_3$ and the input matching network $I_1$ and for example conventional microwave frequency matching elements such as transmission line elements and open and shorted stub elements selected according to the oscillation conditions defined by the scattering parameters. Scattering parameter design and impedance matching techniques are wellknown, as for example taught in IEEE Transactions on Microwave Theory and Technique, May 1979, page 379, incorporated herein by reference. The output matching network may be selected so that the frequency response is limited to one octave in order to minimize the effects of unwanted harmonics and to maximize the gain and impedance matching characteristics.

Referring to FIG. 1, the microwave frequency amplifying element $Q_1$ is preferably a gallium arsenide metal semiconductor field-effect transistor (MESFET) having a first gate electrode 24, a source electrode 26 and a drain electrode 28, and coupled in a common source configuration with the source electrode 26 to ground. The drain electrode 28 is coupled to a common input node 30 of the signal channel elements 12, 14 and 16. The gate electrode 24 of the MESFET $Q_1$ in the embodiment of FIG. 1 is coupled to the output terminal of the input matching network $I_1$.

Since each one of the signal channel elements is substantially identical except for the respective output matching networks, only the first such signal channel element 12 is described herein. The signal channel element 12 includes a first diode $D_1$ having a first electrode 32, generally a cathode, coupled to the common node 30, and a second electrode 34, generally an anode, AC coupled through a capacitor $C_1$ to the input terminal of the output matching network $O_1$ and DC coupled through a first choke $X_1$ to a first bias source $V_1$. The diode $D_1$ is preferably a PIN diode with minimum ON resistance to relatively small amplitude microwave signals when the device is forward biased. The purpose of the first bias source $V_1$ is to provide a forward DC bias or a reverse DC bias to the diode $D_1$. In the former case, bias source $V_1$ will also provide appropriate biasing voltage and current for the MESFET $Q_1$ through the drain electrode 28 to the source electrode 26. Additionally, according to the invention, the level of the bias voltage from bias source $V_1$ is preselected to place the MESFET $Q_1$ in its linear operating region. As explained hereinafter, other forward bias means through alternative channels are applied to the MESFET $Q_1$ to cause it to operate in a nonlinear region causing the generation of harmonics.

The first signal channel element 12 further includes a second diode $D_4$ having a first electrode 36, generally a cathode, coupled to a common output node 40 at the output of the signal channel elements 12, 14, 16, and a second electrode 38, generally an anode, AC coupled through a second capacitor $C_4$ to the output of the output matching network $O_1$ and DC coupled through a second choke $X_4$ to a second bias source $V_4$. The bias voltage of bias source $V_4$ is operative to selectively forward bias the second diode $D_4$ through the node 40 and through an inductor $L_1$ and finite resistance $R_1$ to DC ground. Bias voltage sources $V_1$ and $V_4$ are switched in synchronism, as for example in a switch box 42, in response to a control command or signal from a simple bias control means 44. The bias voltages applied to the YTO 20 and the signal channel elements 12, 14 and 16 may be synchronized to provide a continuous voltage sweep from the lowest fundamental frequency to the highest intended harmonic frequency of operation of the amplifying element $Q_1$ by proper choice of bias voltage to the YTO source and switch closure of the switch box 42. It should also be understood that reverse bias voltage may be applied by the bias sources $V_1$ and $V_4$ to assure that the diodes $D_1$ and $D_4$ are turned off when the channel 12 is not intended to conduct a signal.

The second signal channel element 14 comprises a similar circuit with diodes $D_2$ and $D_5$, AC coupling capacitors $C_2$ and $C_5$, chokes $X_2$ and $X_5$, and bias voltage sources $V_2$ and $V_5$ in connection with the output matching element $O_2$. The first electrode of diode $D_5$ is coupled to the node 40 and thereby to DC ground through the inductor $L_1$.

Also, the third signal channel element 16 comprises first and second diodes $D_3$ and $D_6$ with the first electrode of diode $D_3$ coupled to the common node 30, AC coupling capacitor $C_3$ and $C_6$ at the respective input and output of the third output matching means $O_3$, and chokes $X_3$ and $X_6$ providing DC coupling to bias means $V_3$ and $V_6$. The first electrode of diode $D_6$ is coupled to the common node 40. Other signal channel elements may be coupled to the common nodes 30 and 40 thereby extending the frequency range of the amplifier/multiplier 10. Substantially the only limitation is the frequency range and amplification factor of the MESFET $Q_1$.

Generally the MESFET $Q_1$ is chosen to be any commercially available solid-state amplifying element having, for example, a unity gain maximum frequency of about 40 GHz and a nominal drain impedance of about 50 ohms in the 6 GHz to 12 GHz spectrum.

The amplifier/multiplier 10 of FIG. 1 works as follows: When output over the fundamental frequency range of the YTO 20 is desired, positive voltages are applied (e.g., from the switch box 42 bias network) as bias voltage sources $V_1$ and $V_4$ to forward bias the diodes $D_1$ and $D_4$ while negative or other reverse biasing voltages are applied to $V_2$, $V_5$, $V_3$ and $V_6$ to reverse bias diodes $D_2$, $D_5$, $D_3$ and $D_6$. The bias level of $V_1$ is selected for maximum linear operation of the amplifying element $Q_1$. Microwave signals applied from the YTO 20 are impedance matched through the input network $I_1$ to the amplifying element $Q_1$, and amplified in the amplifying element $Q_1$. The output of the amplifying element $Q_1$ is then matched with the first signal channel element 12 to the output impedance of the output terminal 18, where the amplified microwave signal is available for use.

When operation is desired at a harmonic frequency of the YTO 20, the diodes $D_1$ and $D_4$ are reverse biased by voltages applied as bias voltage sources $V_1$ and $V_4$ and one of the other signal channel elements, e.g., signal channel element 14, is activated by applying forward bias voltages as, for example, bias voltage sources $V_2$ and $V_5$ to forward bias diodes $D_2$ and $D_5$. The bias voltage at $V_2$ also serves as the drain bias to the amplifying element $Q_1$ and is preselected to assure that operation is in a suitable nonlinear region of the amplifying element $Q_1$ thereby converting the system 10 to a frequency multiplier. The output matching network $O_2$ is selected to suppress undesired harmonics while passing the desired harmonic of the fundamental frequency through the network to match the impedance at output terminal 18. The signal is then available for use.

Turning to FIG. 2, there is shown a further embodiment of the invention. The amplifier/multiplier 110 of FIG. 2 differs from the amplifier/multiplier 10 of FIG. 1 in the choice of amplifying element. In the embodiment of FIG. 2, the amplifying element $Q_{11}$ comprises a dual-gate MESFET having a first gate electrode 24 and a second gate electrode 27, a source electrode 26 and a drain electrode 28. The input matching network $I_{11}$ may also differ according to the characteristics of the amplifying element $Q_{11}$. Similarly, the output matching networks $O_{11}$, $O_{12}$ and $O_{13}$ are adapted to provide the correct impedance match between the drain electrode 28 and the output terminal 18 for the frequency range of intended operation of the particular signal channel element. In addition, bias means are provided for the second gate 27 through a bias source $V_g$.

In operation, the gate voltage $V_{g2}$ is accurately controlled for maximum linear operation or optimum linear operation or optimum nonlinear operation, depending upon the desired operating range of the amplifier/multiplier 110. It should be understood that the gate voltage may be provided by one or more different switched power supplies.

Referring to FIG. 3, there is shown a balanced amplifier/multiplier 210 according to the invention. In this further refinement, a pair of devices according to the configuration of FIG. 2 are coupled in parallel to a common node 41 at the output terminal 18. The input from a YTO 20 is provided through a quadrature coupler 46, such as a Lange coupler, feeding a first input matching device $I_{21}$ and a second input matching device $I_{22}$. Only two channels $O_4$ and $O_5$; $O_6$ and $O_7$ per phase are shown. It should be understood that more than two signal channel elements per phase may be employed.

In the embodiment of FIG. 3, the output coupling network $O_4$ and $O_5$ each incorporate an additional 90 degrees of phase shift relative to the midrange frequency of operation of the corresponding output matching circuits, respectively $O_6$ and $O_7$. In addition, further bias voltages are required under control of an appropriate bias control means 144 through, for example, a switching network 142. The operation of bias means $V_7$, $V_9$, $V_{11}$ and $V_{13}$ operate synchronously. There are also separate bias means provided for the second input gates $V_{g22}$ and $V_{g32}$ to the amplifying elements $Q_2$ and $Q_3$. The Lange coupler 46 operates to split the input signal from the YTO 20 into two equal parts which are in phase quadrature relationship. This places the signal at the input of amplifying element $Q_2$ 90 degrees out of phase with the signal at the input of amplifying element $Q_3$. It is necessary to correct the phase difference to avoid cancellation of the signals. This is accomplished in the output matching circuits $O_4$ and $O_5$ by the addition of a quarter wave matching element 48 in $O_4$ and a half wave matching element 50 in $O_5$. Consequently, the signals reach the output node 41 in additive phase relationship to one another, since the fundamental frequencies differ by a quarter wave and the harmonic frequency of the second harmonic differs by 180 degrees or one half wave. Additional multiple harmonic frequency elements may also be corrected by the provision of a phase correction element in the output matching network.

The invention has now been described with reference to specific embodiments. Other embodiments will be apparent to those of ordinary skill in the art. It is therefore not intended that this invention be limited except as indicated by the appended claims.

What is claimed is:

1. A microwave signal amplifying and multiplying apparatus capable of substantially continuous tuning over a first frequency range which is greater than a first tunable frequency range of a continuously tunable microwave frequency oscillator, said apparatus comprising:

input matching means for coupling to a single microwave frequency oscillator;

a solid-state microwave frequency amplifying element having a first gate electrode, a drain electrode and a source electrode, said amplifying element being operable at a first bias level over said first microwave frequency range as a signal amplifier and at least a second bias level as a signal amplifier and multiplier over harmonics of said first frequency range;

a plurality of signal channel means, each signal channel means having a signal input terminal coupled to a signal output terminal in common with other signal channel means, each said signal channel means comprising:

(a) a first diode having a first electrode and a second electrode, said first electrode being DC coupled to said drain electrode through said input terminal and said second electrode being DC coupled to a bias terminal;

(b) a microwave frequency output matching network coupled to receive microwave signals through said first diode, said matching network being specific to a selected range of frequency different from ranges of frequency of other ones of said signal channel means; and (c) a second diode coupled to receive microwave signals through said output matching network and having a first electrode and a second electrode, said first electrode thereof being coupled to said common output terminal and said second electrode thereof being DC coupled to a bias means;

first bias means for selectively forward and reverse biasing each one of said first diodes;

second bias means for selectively forward and reverse biasing each one of said second diodes;

said amplifying element being coupled in a common source configuration with said source electrode coupled to ground and wherein said first bias means is operative to provide forward bias to said first diode and to preselect a desired operating region of said amplifying element, said first and second bias means being switchable in concert to couple and uncouple said amplifying element through a selected one of said plurality of signal channel means to said common output.

2. The apparatus according to claim 1 wherein said amplifying element is a metal semiconductor field-effect transistor.

3. The apparatus according to claim 2 wherein said field effect transistor further includes a second gate electrode and third means for biasing said second gate electrode.

4. The apparatus according to claim 1 further including first microwave frequency choke means and second microwave frequency choke means, said first microwave frequency choke means being coupled between said second electrode of said first diode and said first bias means and said second choke being coupled between said second electrode of said second diode and said second bias means.

5. The apparatus according to claim 1 wherein each said matching network comprises a passive impedance matching network for matching the output impedance of said microwave frequency oscillator to the input impedance of said amplifying element at said first gate electrode over said first frequency range, and wherein each said matching network is incorporated in a common microwave frequency integrated circuit.

6. A microwave signal amplifying and multiplying system for use in generating a balanced signal in connection with a tunable microwave frequency oscillator comprising;

a first microwave signal amplifying and multiplying apparatus having first input matching means, a solid-state microwave frequency amplifying element having a first gate electrode, a drain electrode and a source electrode, said amplifying element being operable at a first bias level over a first microwave frequency range as a signal amplifier, said first microwave frequency range being greater than a first tunable frequency range of a continuously tunable microwave frequency oscillator, and at least a second bias level as a signal amplifier and multiplier over harmonics of said first frequency range and a plurality of first and second microwave signal switching diodes for conveying a microwave signal between said first input matching means and a common signal output terminal, said second diodes having first and second electrodes, said second electrodes being coupled to said common signal output terminal;

a second microwave signal amplifying and multiplying apparatus having second input matching means, a solid-state microwave frequency amplifying element having a first gate electrode, a drain electrode and a source electrode, said amplifying element being operable at a first bias level over a first microwave frequency range being greater than a first tunable frequency range of a continuously tunable microwave frequency oscillator, and at least a second bias level as a signal amplifier and multiplier over harmonics of said first frequency range and a plurality of third and fourth microwave signal switching diodes for conveying a microwave signal between said second input matching means and said common signal output terminal, said fourth diodes having first and second electrodes, said second being coupled to said common signal output terminal;

quadrature coupling means having an input terminal for coupling to said oscillator, a first output terminal and a second output terminal, said first output terminal being coupled to said first input matching means of said first apparatus, said second output terminal being coupled to said second input matching means of said second apparatus, and said second electrodes of said second diodes and of said fourth diodes being coupled to said common signal output terminals; and bias means wherein said bias means is operative to activate one channel means of said first apparatus simultaneously with a corresponding channel means of said second apparatus.

7. The apparatus according to claim 6 further including means for shifting the phase of microwave signal applied through said first apparatus with respect to a microwave signal applied through said second apparatus so that signals add in phase at said signal output terminal.

8. The apparatus according to claim 7 further including means in said channel means of said first output matching network comprising a quarter wavelength of transmission line for compensating for phase shift through said first output terminal of said quadrature coupling means.

9. The apparatus according to claim 1 wherein said amplifying element is a dual-gate gallium arsenide metal semiconductor field-effect transistor and wherein each one of said diodes is a PIN diode.

* * * * *